(12) United States Patent
Zheng (10) Patent No.: US 9,429,604 B2
(45) Date of Patent: Aug. 30, 2016

(54) THREE-PHASE AC PHASE SEQUENCE DETECTING METHOD AND APPARATUS

(71) Applicants: BOE TECHNOLOGY GROUP CO., LTD., Beijing (CN); BEIJING BOE ENERGY TECHNOLOGY CO., LTD., Beijing (CN)

(72) Inventor: Ping Zheng, Beijing (CN)

(73) Assignees: BOE TECHNOLOGY GROUP CO., LTD., Beijing (CN); BEIJING BOE ENERGY TECHNOLOGY CO., LTD., Beijing (CN)

( * ) Notice: Subject to any disclaimer, the term of this patent is extended or adjusted under 35 U.S.C. 154(b) by 382 days.

(21) Appl. No.: 13/983,351

(22) PCT Filed: Dec. 5, 2012

(86) PCT No.: PCT/CN2012/085962
§ 371 (c)(1),
(2) Date: Aug. 2, 2013

(87) PCT Pub. No.: WO2013/155844
PCT Pub. Date: Oct. 24, 2013

(65) Prior Publication Data
US 2014/0062457 A1   Mar. 6, 2014

(30) Foreign Application Priority Data

Apr. 20, 2012  (CN) .......................... 2012 1 0119020

(51) Int. Cl.
*G01R 29/18*   (2006.01)
*G01R 25/00*   (2006.01)

(52) U.S. Cl.
CPC .............. *G01R 25/00* (2013.01); *G01R 29/18* (2013.01)

(58) Field of Classification Search
CPC ............................... G01R 29/18; G01R 25/00
USPC ............................................................. 324/86
See application file for complete search history.

(56) References Cited

U.S. PATENT DOCUMENTS

2008/0265864 A1* 10/2008 Coolidge ............... G01R 25/00
324/66
2009/0147540 A1*  6/2009 Conticelli ......... H02M 7/53875
363/7

(Continued)

FOREIGN PATENT DOCUMENTS

CN          1387048 A      12/2002
CN        102680806 A       9/2012

OTHER PUBLICATIONS

International Search Report issued Mar. 1, 2013; PCT/CN2012/085962.
First Chinese Office Action dated Jul. 29, 2013; Appl. No. 201210119020.1.
Chinese Rejection Decision dated Apr. 21, 2014; Appln. No. 201210119020.1.

(Continued)

*Primary Examiner* — Jeff Natalini
(74) *Attorney, Agent, or Firm* — Ladas & Parry LLP (57) ABSTRACT

The disclosure provides a three-phase AC phase sequence detecting method, including the steps of: 1) sampling instant values of three-phase AC electrical signal in real-time; 2) converting said instant values into electrical signal components in a two-phase still coordinate system in manner of coordinate conversion; 3) performing an arc tangent calculation on the electrical signal components to obtain a output signal value; 4) executing step 1) to step 3) one or more times, to obtain one or more output signal values; 5) the output signal values obtained from step 3) and the one or more output signal values obtained from step 4) composing a periodic function, if the periodic function is an increasing function within one minimum positive period, the three-phase AC phase sequence is determined to be positive sequence; otherwise, negative sequence. Three-phase AC phase detecting a detecting apparatus using the above detecting method is also provided.

9 Claims, 5 Drawing Sheets

(56) References Cited

U.S. PATENT DOCUMENTS

| | | | |
|---|---|---|---|
| 2010/0171526 A1* | 7/2010 | Chang | H03D 13/006 327/7 |
| 2012/0038502 A1* | 2/2012 | Boulanger | G01S 13/784 342/40 |
| 2014/0062457 A1 | 3/2014 | Zheng | |

OTHER PUBLICATIONS

International Preliminary Report on Patentability dated Oct. 21, 2014; PCT/CN2012/085962.

Chinese Notification of Reexamination dated Mar. 4, 2015; Appln. No. 201210119020.1.

* cited by examiner

THREE-PHASE AC PHASE SEQUENCE DETECTING METHOD AND APPARATUS

FIELD OF THE INVENTION

The present disclosure relates to a three-phase alternating current technical field, and more particularly, relates to a three-phase alternating current phase sequence detecting method and a three-phase alternating current phase sequence detecting apparatus using said detecting method.

BACKGROUND

Figure 1:
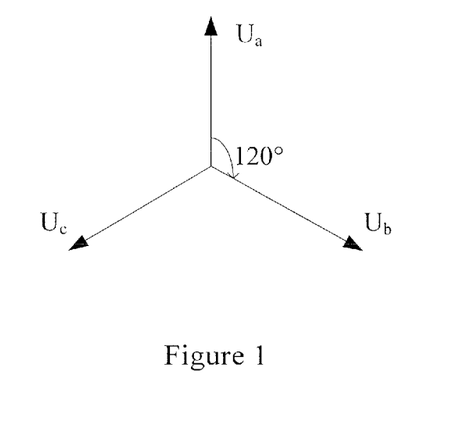
FIG. 1 is a schematic diagram of a three-phase AC voltage positive sequence vector in prior art.
Figure 2:
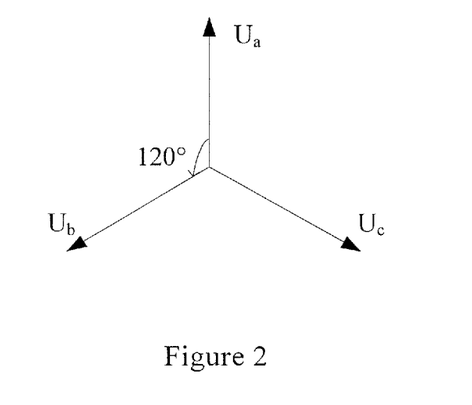
FIG. 2 is a schematic diagram of a three-phase AC voltage negative sequence vector in prior art.

Three-phase AC phase sequence has critical impacts on whether a three-phase powered device can normally operate or not. Usually, a three-phase AC power source of the three-phase powered device requires positive sequence (as shown in FIG. 1) rather than negative sequence (as shown in FIG. 2). Take electrical drive device as an example, once the three-phase AC power source has wrong sequence, it will result in the inverse operation of the electrical drive device, and lead to the fault of the electrical drive device, even be harmful to operators. Hence, it needs to introduce a three-phase AC phase sequence detection and a decision function in the control of electrical drive device.

In the prior art, the three-phase AC phase sequence is determined by extracting angular frequency information of three-phase AC and determining the angular frequency information. Though the above method can achieve a precise detection of phase sequence, since it needs to extract the angular frequency information of three-phase AC and there are a feedback circuit and an adjustment of error signal during the process of angular frequency extraction, the control system is complicated.

SUMMARY OF THE INVENTION

The problems that the present disclosure is going to solve aim at the above flaws existed in the prior art, providing a three-phase AC phase sequence detecting method, which is easy to use, without feedback circuits and parameter adjustments, and able to detect three-phase AC phase sequence quickly and precisely, and a three-phase AC phase sequence detecting apparatus by using the detecting method.

The technical solutions solving the technical problems of the disclosure are:

The three-phase AC sequence detecting method, including the steps of:
1) real-time sampling instant values of three-phase AC electrical signal to have a set of instant values;
2) converting the set of instant values into electrical signal components in a two-phase still coordinate system in manner of coordinate conversion;
3) performing an arc tangent calculation on the electrical signal components to have an output signal value corresponding to a sampling timing;
4) executing step 1) to step 3) one or more times, to obtain one or more output signal values corresponding to one or more sampling timings adjacent with said sampling timing at step 3);
5) the output signal values obtained from step 3) and the one or more output signal values obtained from step 4) composing a periodic function, which is a linear function within one minimum positive period, and the period of the periodic function are the same as that of the three-phase AC electrical signal, determining the three-phase AC phase sequence to be positive or negative based on whether the periodic function is an increasing or a decreasing function within one minimum positive period: if the periodic function is an increasing function within one minimum positive period, the three-phase AC phase sequence is determined to be positive sequence; if the periodic function is a decreasing function within one minimum positive period, the three-phase AC phase sequence is determined to be negative sequence.

For example, the three-phase AC electrical signal is the three-phase AC phase voltage signal or the three-phase AC phase current signal.

For example, in the step 2), the manner of coordinate conversion is to use the Clarke coordinate conversion;

The equation of the Clarke coordinate conversion is:

$$\begin{cases} \begin{bmatrix} D_\alpha \\ D_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} D_a \\ D_b \\ D_c \end{bmatrix} \\ D_a + D_b + D_c = 0 \end{cases} \quad (1)$$

Wherein: $D_a$, $D_b$ and $D_c$ are the instant values of three-phase AC electrical signal, $D_\alpha$ and $D_\beta$ are the electrical signal components in the two-phase still coordinate system after the Clarke coordinate conversion is performed on instant values $D_a$, $D_b$ and $D_c$.

For example, in the step 3), the equation used to perform an arc tangent calculation on the electrical signal components is:

$$y = \begin{cases} \arctan(D_\beta/D_\alpha) & 0 < \arctan(D_\beta/D_\alpha) < \pi \\ \arctan(D_\beta/D_\alpha) + 2\pi & -\pi < \arctan(D_\beta/D_\alpha) < 0 \end{cases} \quad (2)$$

wherein, y is the output signal value, $D_\alpha$ and $D_\beta$ are the electrical signal components in the two-phase still coordinate system after the Clarke coordinate conversion is performed on instant values $D_a$, $D_b$ and $D_c$.

For example, the sampling period is greater than the sampling error and less than the period of three-phase AC electrical signal.

Further for example, in the step 5), the way to determine whether the periodic function is an increasing or a decreasing function within one minimum positive period is: $\Delta y = y(n) - y(n-1)$, wherein, $y(n)$ and $y(n-1)$ are the output signal values corresponding to the instant values of three-phase AC electrical signals obtained by sampling a electrical signal of the three-phase AC electrical signal at two adjacent sampling timings within one minimum positive period, respectively,
if $0 < \Delta y < 2\pi$, the periodic function is an increasing function within one minimum positive period; if $-2\pi < \Delta y < 0$, the periodic function is a decreasing function within one minimum positive period.

Further for example, the sampling period is less than or equal to 0.1 times of the period of the three-phase AC electrical signal.

For example, the step 1) also includes per-unit processing the set of instant values, the equation of per-unit processing is:

$$d_x = D_x / d_{max} \quad (3)$$

wherein, x is a, b and c, $D_a$, $D_b$ and $D_c$ are the instant values of the three-phase AC electrical signals, $d_{max}$ is the maximum value of three-phase AC electrical signal, $d_a$, $d_b$ and $d_c$ are the per-unit values of the instant values of the three-phase AC electrical signals.

For example, step 3) also includes per-unit processing the output signal value, the equation of per-unit processing is:

$$y^* = y/2\pi \qquad (4)$$

wherein, y is the output signal value, y* is the per-unit value of the output signal value.

The disclosure also provides a three-phase AC phase sequence detecting apparatus, including a three-phase AC sampling module, a coordinate system conversion module, an arc tangent function calculation module and a phase sequence direction determining module;
the three-phase AC sampling module performs real-time sampling on the instant values of three-phase AC electrical signals;
the coordinate system conversion module converts the instant value of at least two sets of three-phase AC electrical signals in a three-phase still coordinate system obtained by real-time sampling via the three-phase AC sampling module into electrical signal components in a two-phase still coordinate system, and transfer them to the arc tangent function calculation module in real-time;
the arc tangent function calculation module performs an arc tangent calculation on the electrical signal components, respectively, to obtain at least two output signal values, and transfer them to the phase sequence direction determining module;
the phase sequence direction determining module determines whether the three-phase AC phase sequence are positive or negative based on whether the periodic function consisted of at least two output signal values is an increasing function or a decreasing function within one minimum positive period.

For example, the detecting apparatus also includes a first per-unit processing module and/or a second per-unit processing module,
the first per-unit processing module per-unit processes the instant values of the at least two sets of three-phase AC electrical signals obtained by real-time sampling via the three-phase AC sampling module, and output the per-unit values to the coordinate system conversion module in real-time;
the second per-unit processing module per-unit processes at least two output signals obtained by the arc tangent function calculation module, and output the per-unit values to the phase sequence direction determining module in real-time;
Advantageous Effects:
(1) the three-phase AC electrical signal that the present disclosure needs is phase voltage signal or phase current signal, therefore there is no need to convert it to line voltage signal or line current signal, and it is simple and convenient.
(2) the present disclosure can be directly applied to digital control area to detect three-phase
AC electrical signal phase sequence quickly and precisely, without adding new peripheral hardware circuit, determining method is easy and reliable, meanwhile it has an easy detecting algorithm, no need of feedback circuits, no need of parameter adjustments and it is suitable for embedded system development or the like.
(3) the present disclosure has strong anti-interference ability, it can detect the phase sequence of the three-phase AC electrical signals quickly and precisely even there is sever harmonic waves in the three-phase AC electrical signals or under a unbalance situation.

BRIEF DESCRIPTION OF THE DRAWINGS

FIG. 4-1 to FIG. 4-3 are waveform charts of various parameters when the three-phase AC phase sequence according to the first embodiment of the disclosure are positive sequence;
FIG. 4-1 is a waveform chart of per-unit values $u_a$ and $u_b$ of the two-phase instant values $U_a$ and $U_b$ of three-phase AC phase voltage (the waveform chart of per-unit value $u_c$ of $U_c$ is not shown);
FIG. 4-2 is a waveform chart of phase voltage components $u_\alpha$, and $u_\beta$ in two-phase still coordinate system obtained after the Clarke coordinate conversion is performed on the per-unit values $u_a$, $u_b$ and $u_c$;
FIG. 4-3 is a waveform chart of the per-unit value y* of the output signal value after the arc tangent calculation and then per-unit processing are performed on the phase voltage components $u_\alpha$ and $u_\beta$ in two-phase still coordinate system;
FIG. 5-1 to FIG. 5-3 are waveform charts of various parameters when the three-phase AC phase sequence according to the first embodiment of the disclosure are negative sequence;
FIG. 5-1 is a waveform chart of per-unit values $u_a$ and $u_b$ of the two-phase instant values $U_a$ and $U_b$ of three-phase AC phase voltage (the waveform chart of per-unit value $u_c$ of $U_c$ is not shown);
FIG. 5-2 is a waveform chart of phase voltage components $u_\alpha$, and $u_\beta$ in two-phase still coordinate system obtained after the Clarke coordinate conversion is performed on the per-unit values $u_a$, $u_b$ and $u_c$;
FIG. 5-3 is a waveform chart of the per-unit value y* of the output signal value obtained after the arc tangent calculation and then per-unit processing are performed on the phase voltage components $u_\alpha$, and $u_\beta$ in two-phase still coordinate system.

DETAILED DESCRIPTION OF THE PREFERRED EMBODIMENTS

Three-phase AC phase sequence detecting method and apparatus will be further described in details in conjunction with appended drawings and embodiments below, so that the skilled in the art can understand the technical solutions better.

A three-phase AC phase sequence detecting method, including the steps of:
1) real-time sampling instant values of three-phase AC electrical signal to have a set of instant values;
2) converting the set of instant values into electrical signal components in a two-phase still coordinate system in manner of coordinate conversion;
3) performing an arc tangent calculation on the electrical signal components to have an output signal value corresponding to a sampling timing;

4) executing step 1) to step 3) one or more times, to obtain one or more output signal values corresponding to one or more sampling timings adjacent with said sampling timing at step 3);

5) combining the output signal values obtained from step 3) and the one or more output signal values obtained from step 4) to be a periodic function, which is a linear function within one minimum positive period, and the period of the periodic function is the same as that of the three-phase AC electrical signal, determining the three-phase AC phase sequence to be positive or negative based on whether the periodic function is an increasing or a decreasing function within one minimum positive period: if the periodic function is an increasing function within one minimum positive period, the three-phase AC phase sequence is determined to be positive sequence; if the periodic function is a decreasing function within one minimum positive period, the three-phase AC phase sequence is determined to be negative sequence.

A three-phase AC phase sequence detecting apparatus, including a three-phase AC sampling module, a coordinate system conversion module, an arc tangent function calculation module and a phase sequence direction deciding determining module;

the three-phase AC sampling module performs real-time sampling on the instant values of three-phase AC electrical signals;

the coordinate system conversion module converts the instant value of at least two sets of three-phase AC electrical signals in a three-phase still coordinate system obtained by real-time sampling via the three-phase AC sampling module into electrical signal components in a two-phase still coordinate system, and transfer them to the arc tangent function calculation module in real-time;

the arc tangent function calculation module performs an arc tangent calculation on the electrical signal components, respectively, to obtain at least two output signal values, and transfer them to the phase sequence direction determining module;

the phase sequence direction determining module determines whether the three-phase AC phase sequence are positive or negative based on whether the periodic function consisted of at least two output signal values is an increasing function or a decreasing function within one minimum positive period.

First Embodiment

In the embodiment, the three-phase AC electrical signal (the instant values of which are $D_a$, $D_b$ and $D_c$) is three-phase AC phase voltage signal.

Figure 3:
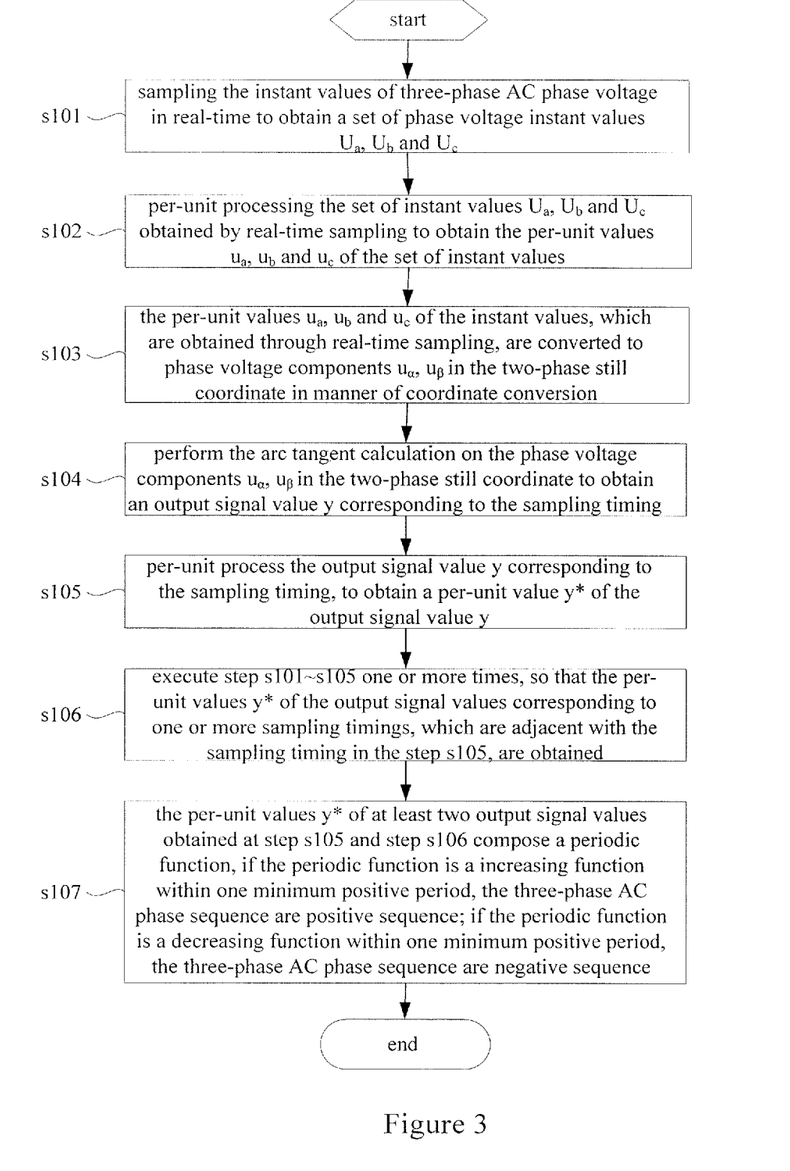
FIG. 3 is a flowchart of the three-phase AC phase sequence detecting method according to the first embodiment of the disclosure.

As shown in FIG. 3, the three-phase AC phase sequence detecting method includes the steps of:

s101: sampling the instant values of three-phase AC phase voltage in real-time to obtain a set of phase voltage instant values $U_a$, $U_b$ and $U_c$, the instant values are in three-phase still coordinate system.

wherein, the sampling period is greater than the sampling error and is less than the period of the three-phase AC phase voltage.

s102: per-unit processing the set of instant values $U_a$, $U_b$ and $U_c$ obtained by real-time sampling to obtain the per-unit values $u_a$, $u_b$ and $u_c$ of the set of instant values.

The per-unit value is numerical scaling method used in electrical system analysis and engineering calculation, the per-unit value indicates a relative value of some/some set of parameter, and the per-unit value=the actual value/reference value. The process of per-unit processing some/some set of parameters is the process of calculating its/their per-unit value(s). The applying of per-unit processing can omit the proportion coefficients in the equations and simplify the calculation, and it is easier to calculate and analytically compare the results. In the embodiment, per-unit process is for example deployed. However, if not deployed, the result of deciding determining the phase sequence of three-phase AC electrical signal will not be affected.

In the embodiment, the equation, which per-unit processes the instant values $U_a$, $U_b$ and $U_c$ of the three-phase AC phase voltage, is:

$$u_x = U_x / u_{max} \tag{5}$$

wherein, x is a, b and c, $U_a$, $U_b$, and $U_c$ are the instant values of the three-phase AC phase voltage, $U_{max}$ is the maximum value of the three-phase AC phase voltage, $u_a$, $u_b$ and $u_c$ are the per-unit values of the instant values of the three-phase AC phase voltage.

s103. the per-unit values $u_a$, $u_b$ and $u_c$ of the set of the instant values, which are obtained through real-time sampling, are converted to phase voltage components $u_\alpha$, $u_\beta$ in two-phase still coordinate system in manner of coordinate conversion.

In the embodiment, the manner of coordinate conversion is to use the Clarke coordinate conversion, which is able to convert the three-phase still coordinate system to two-phase still coordinate system. The equation of the Clarke coordinate conversion is:

$$\begin{cases} \begin{bmatrix} u_\alpha \\ u_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} u_a \\ u_b \\ u_c \end{bmatrix} \\ u_a + u_b + u_c = 0 \end{cases} \tag{6}$$

wherein, $u_a$, $u_b$ and $u_c$ are the per-unit values of the instant values of the three-phase AC phase voltage, $u_\alpha$, $u_\beta$ are the phase voltage components in the two-phase still coordinate system after Clarke coordinate converting per-unit values $u_a$, $u_b$ and $u_c$.

s104. perform the arc tangent calculation on the phase voltage components $u_\alpha$, $u_\beta$ in the two-phase still coordinate to obtain an output signal value y corresponding to the sampling timing (that is the timing when the set of the instant values of phase voltage $U_a$, $U_b$, and $U_c$ were obtained by sampling).

The equation used to perform an arc tangent calculation on the phase voltage components is:

$$y = \begin{cases} \arctan(u_\beta / u_\alpha) & 0 < \arctan(u_\beta / u_\alpha) < \pi \\ \arctan(u_\beta / u_\alpha) + 2\pi & -\pi < \arctan(u_\beta / u_\alpha) < 0 \end{cases} \tag{7}$$

wherein, y is the output signal, $u_\alpha$, $u_\beta$ are the phase voltage components in the two-phase still coordinate system, therefore $0 < y < 2\pi$.

s105. Per-unit process the output signal value y corresponding to the sampling timing, to obtain a per-unit value y* of the output signal value y.

The equation used to perform per-unit processing on the output signal value y is:

$$y^* = y/2\pi \quad (4)$$

$$y^* = \begin{cases} \arctan(u_\beta/u_\alpha)/2\pi & 0 < \arctan(u_\beta/u_\alpha) < \pi \\ \arctan(u_\beta/u_\alpha)/2\pi + 1 & -\pi < \arctan(u_\beta/u_\alpha) < 0 \end{cases} \quad (8)$$

that is,
wherein, y is the output signal value, y* is the per-unit value of the output signal value, so 0<y*<1.

s106. Execute steps s101~s105 one or more times, so that the per-unit values y* of the output signal values corresponding to one or more sampling timings adjacent with the sampling timing of the step s105, are obtained;

s107. a periodic function is constituted according to the per-unit values y* of at least two output signal values obtained at step s105 and step s106 (the ordinate is the per-unit value y* of output signal value, and the abscissa is the sampling period), the periodic function is a linear function within one minimum positive period, and the period of the periodic function is the same as that of the three-phase AC phase voltage, determining the three-phase AC phase sequence to be positive or negative based on whether the periodic function is an increasing or a decreasing function within one minimum positive period: if the periodic function is an increasing function within one minimum positive period, it shows that $U_a$ is ahead of $U_b$ by 120°, which means the three-phase AC phase sequence is positive sequence, $U_a$ and $U_b$ are instant values of any two-phase voltage in the instant values of the three-phase AC phase voltage; if the periodic function is a decreasing function within one minimum positive period, it shows that $U_a$ is behind $U_b$ by 120°, which means the three-phase AC phase sequence is negative sequence, $U_a$ and $U_b$ are instant values of the any two-phase voltage in the instant values of the three-phase AC phase voltage.

Theoretically, in order to determine whether the periodic function is an increasing function or a decreasing function within one minimum positive period, the output signal values corresponding to the two sets of the instant values of three-phase AC phase voltage at two adjacent sampling timings are only required. That is, all it needs is the per-unit value y* of one output signal value corresponding to the sampling timing in step s105, and the per-unit value y* of one output signal value corresponding to the sampling timing adjacent with the one in step s105 in step s106. The detailed method about how to determine whether the periodic function is an increasing function or a decreasing function within one minimum positive period is:

FIG. 4-1 to FIG. 4-3 and FIG. 5-1 to FIG. 5-3 are the waveform charts of parameters $U_a$、$u_b$、$u_\alpha$、$u_\beta$ and y*, respectively, when three-phase AC phase sequence is positive sequence and negative sequence. Because the vector sum of three-phase AC phase voltages is zero, the waveform of the third phase voltage is known if any two phase voltages were sampled. Therefore, the waveform chart of $u_c$ is not shown in FIG. 4-1 to FIG. 4-3 and FIG. 5-1 to FIG. 5-3. Because the period of the periodic function is the same with the period of the three-phase AC phase voltage, define the waveform between two adjacent peaks in the waveform of any phase voltage in three-phase AC phase voltage to be the waveform within one minimum positive period, which means the waveform between the two adjacent peaks corresponds to one minimum positive period, and in the three-phase AC phase voltage, there must be some phase voltage (such as $u_a$), the phase voltage values at the two adjacent peaks in one minimum positive period respectively corresponds to the maximum value or the minimum value of the linear function within one minimum positive period of the periodic function, as shown in FIG. 4-1 to FIG. 4-3 and FIG. 5-1 to FIG. 5-3.

Let Δy*=y*(n)−y*(n−1), wherein, y*(n) is the per-unit values of output signal values corresponding to the instant value $u_a$ sampled at some timing within one minimum positive period of some phase voltage (such as $u_a$) of the three-phase AC phase voltage and instant values $u_b$ and $u_c$ of other two phase voltages sampled at the same timing. And y*(n−1) is the per-unit values of the output signal values corresponding to the instant values of the three-phase AC phase voltage sampled at the adjacent timing within the same three-phase AC phase voltage's minimum positive period as the some sampled timing. That is, y*(n) and y*(n−1) are the per-unit values of the output signal values corresponding to the instant values of the three-phase AC phase voltage, sampled at two adjacent timings within one minimum positive period of some phase voltage (such as $u_a$) in the three-phase AC phase voltage.

since the sampling period is greater than the sampling error and less than the period of three-phase AC phase voltage, let Δt=k1T, wherein k1 is the coefficient, and 0<k1<1, Δt is the sampling period, T is the period of the three-phase AC phase voltage.

Whether the periodic function is an increasing function or a decreasing function within one minimum positive period can be determined by the interval values where Δy* belongs:
1) when the periodic function is an increasing function within one minimum positive period, Δy*=k1 according to proportional relation, then 0<Δy*<1;
2) when the periodic function is a decreasing function within one minimum positive period, Δy*=−k1 according to proportional relation, then −1<Δy*<0.

To sum up, when 0<Δy*<1, the periodic function is an increasing function within one minimum positive period; and when −1<Δy*<0, the periodic function is a decreasing function within one minimum positive period.

For example, the sampling period Δt is less than or equal to 0.1 times of the period T of the three-phase AC electrical signal, that is Δt≤0.1T.

Figure 6:
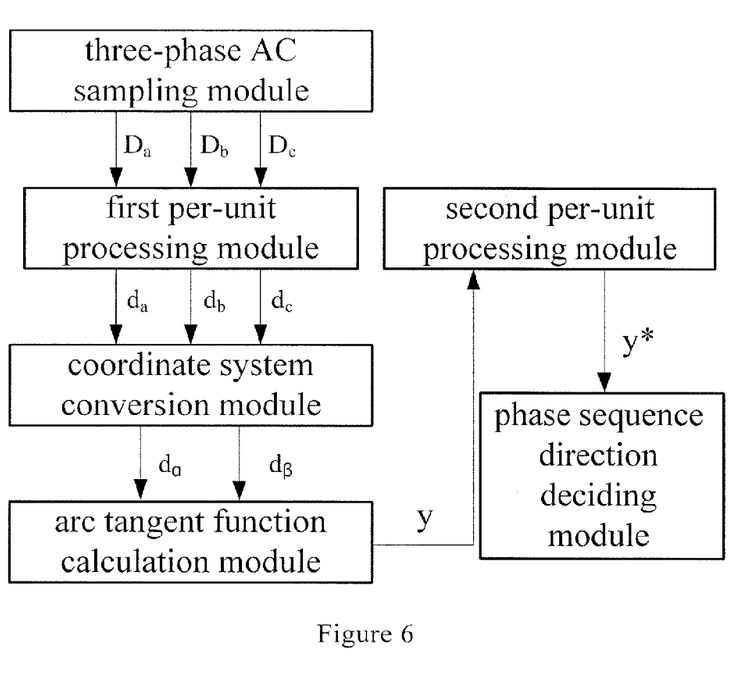
FIG. 6 is a schematic diagram of the structural constitutes of the three-phase AC phase sequence detecting apparatus according to the first embodiment of the disclosure.
Figure 41:
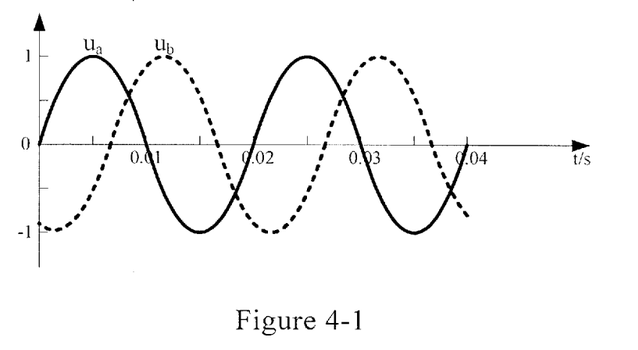
Figure 42:
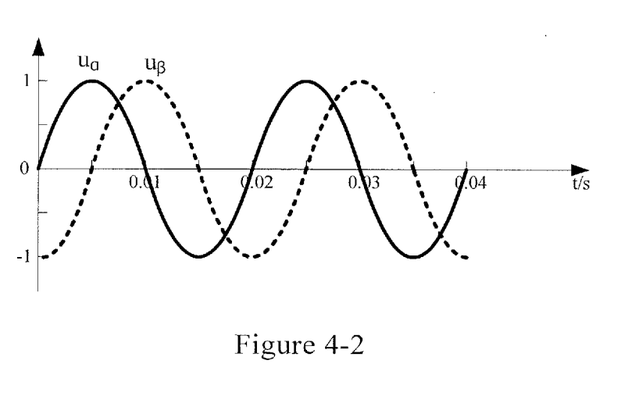
Figure 43:
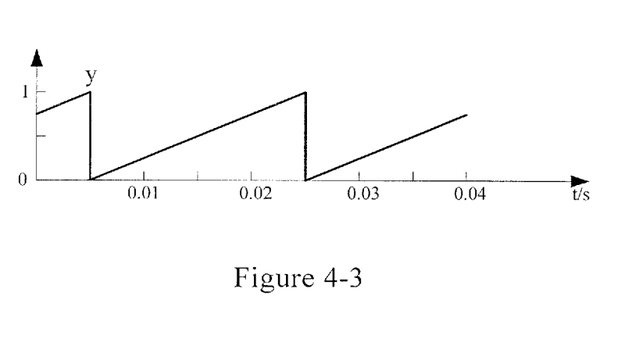
Figure 51:
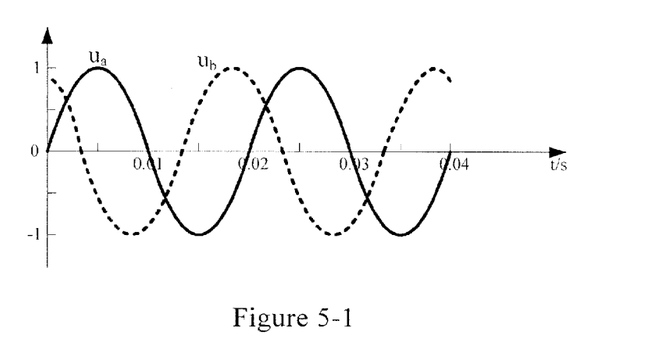
Figure 52:
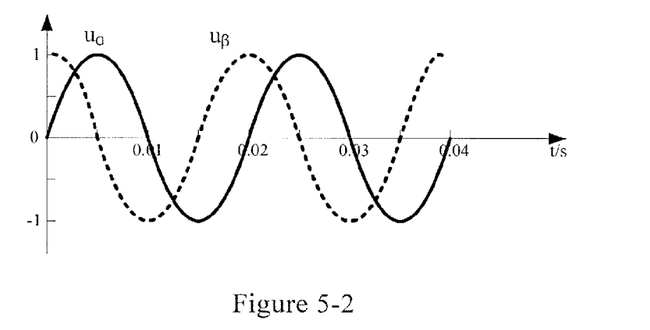
Figure 53:
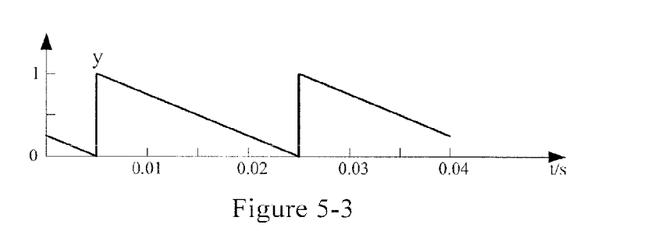

As shown in FIG. 6, the embodiment also provides a three-phase AC phase sequence detecting apparatus, including a three-phase AC sampling module, a coordinate system conversion module, an arc tangent function calculation module, a first per-unit processing module, a second per-unit processing module and a phase sequence direction determining module.

The three-phase AC sampling module performs real-time sampling on the instant values of three-phase AC electrical signals, and transfer to the first per-unit processing module at least two sets of instant values $D_a$、$D_b$ and $D_c$ of the three-phase AC electrical signals real-time sampled in the three-phase still coordinate system.

The first per-unit processing module per-unit processes the at least two sets of instant values $D_a$、$D_b$ and $D_c$ of the three-phase AC electrical signals respectively, and transfer to the coordinate system conversion module at least two sets of obtained per-unit values $d_a$, $d_b$ and $d_c$ respectively.

The coordinate system conversion module converts per-unit values $d_a$, $d_b$ and $d_c$ of the instant values of at least two sets of three-phase AC electrical signals in a three-phase still coordinate system to the electrical signal components $d_\alpha$, $d_\beta$ in a two-phase still coordinate system respectively, and transfer the at least two sets of obtained electrical signal components to the arc tangent function calculation module in real-time. Of course, the per-unit values of the instant values of each set of three-phase AC electrical signal correspond to a set of different electrical signal components.

The arc tangent function calculation module performs an arc tangent calculation on the at least two sets of electrical signal components $d_\alpha$、 $d_\beta$ respectively, obtain at least two output signal values y, and transfer to the second per-unit processing module the at least two output signal values y.

The second per-unit processing module per-unit processes the at least two output signal values y, and transfer to the phase sequence direction determining module the obtained at least two per-unit values y* in real time.

The phase sequence direction determining module determines whether the three-phase AC phase sequence are positive or negative according to whether the periodic function composed of the per-unit processing values y* of the at least two output signal values is an increasing one or a decreasing one within one minimum positive period. If the periodic function is an increasing function within one minimum positive period, the three-phase AC phase sequence are positive sequence; if the periodic function is a decreasing function within one minimum positive period, the three-phase AC phase sequence are negative sequence.

Amongst other things, the three-phase AC electrical signal is three-phase AC phase voltage signals (the instant values of which are $U_a$, $U_b$ and $U_c$) or three-phase AC phase current signal (the instant values of which are Ia, Ib and Ic); the three-phase AC sampling module can use the current modules, such as Hall sensor, resistor dividing sampling module, current transformer or the like; the coordinate system conversion module can use the current Clarke coordinate system conversion module.

Second Embodiment

The three-phase AC phase sequence detecting method according to this embodiment being different from the first embodiment is that:
1) The three-phase AC electrical signals are three-phase AC phase current signals (the instant values of which are Ia, Ib and Ic), and the period of the known three-phase AC phase current is the same with the period of the three-phase AC phase voltage;
2) The detecting method according to this embodiment does not include step s102 and/or step s105, that is, the detecting method does not include the step of per-unit processing the instant values (Ia, Ib and Ic) of the three-phase AC phase current nor the step of per-unit processing the output signal values corresponding to the sampling timings.

The three-phase AC phase sequence detecting apparatus according to this embodiment being different from the first embodiment is that: the detecting apparatus does not include the first per-unit processing module and/or the second per-unit processing module.

The rest of the structures and efforts of this embodiment is as the same as the first embodiment, the description thereof will be omitted.

It should be understood that the above mentioned ways are merely illustrative embodiments for the explaining of the principles of the disclosure, however the disclosure is not restricted thereby. To those skilled in the art, various modifications and improvements can be made without departing from the spirit and the substance of the disclosure, those modifications and improvements are also within the protective scope of the disclosure.

The invention claimed is:

1. A three-phase AC phase sequence detecting method, including the steps of:
   1) sampling instant values of a three-phase AC electrical signal in real-time to obtain a set of instant values;
   2) converting, using coordinate conversion, said set of instant values into electrical signal components in a two-phase still coordinate system;
   3) performing an arc tangent calculation on the electrical signal components to obtain an output signal value corresponding to a sampling timing;
   4) executing step 1) to step 3) one or more times, to obtain one or more output signal values corresponding to one or more sampling timings adjacent with said sampling timing at step 3);
   5) combining the output signal values obtained from step 3) and the one or more output signal values obtained from step 4) to form one periodic function, which is a linear function within one minimum positive period, and the period of the periodic function is the same as that of the three-phase AC electrical signal, determining the three-phase AC phase sequence to be positive or negative based on whether the periodic function is an increasing or a decreasing function within one minimum positive period: if the periodic function is an increasing function within one minimum positive period, the three-phase AC phase sequence is determined to be positive sequence; if the periodic function is a decreasing function within one minimum positive period, the three-phase AC phase sequence is determined to be negative sequence,
   wherein the waveform between two adjacent peaks in the waveform of any phase in three-phase AC electrical signal corresponds to one minimum positive period.

2. The detecting method according to claim 1, wherein the three-phase AC electrical signal is a three-phase AC phase voltage signal or a three-phase AC phase current signal.

3. The detecting method according to claim 1, in the step 2), said conversion is Clarke coordinate conversion; and the following equation of the Clarke coordinate conversion is used:

$$\begin{cases} \begin{bmatrix} D_\alpha \\ D_\beta \end{bmatrix} = \sqrt{\dfrac{2}{3}} \begin{bmatrix} 1 & -\dfrac{1}{2} & -\dfrac{1}{2} \\ 0 & \dfrac{\sqrt{3}}{2} & -\dfrac{\sqrt{3}}{2} \end{bmatrix} \begin{bmatrix} D_a \\ D_b \\ D_c \end{bmatrix} \\ D_a + D_b + D_c = 0 \end{cases} \quad (1)$$

wherein: $D_a$, $D_b$ and $D_c$ are the instant values of three-phase AC electrical signal, $D_\alpha$ and $D_\beta$ are the electrical signal components in the two-phase still coordinate system obtained after the Clarke coordinate conversion is performed on instant values $D_a$, $D_b$ and $D_c$.

4. The detecting method according to claim 3, in the step 3), the equation used to perform the arc tangent calculation on the electrical signal components is:

$$y = \begin{cases} \arctan(u_\beta/u_\alpha) & 0 < \arctan(u_\beta/u_\alpha) < \pi \\ \arctan(u_\beta/u_\alpha) + 2\pi & -\pi < \arctan(u_\beta/u_\alpha) < 0 \end{cases} \quad (2)$$

wherein, y is said output signal value, $D_\alpha$ and $D_\beta$ are the electrical signal components in the two-phase still coordinate system, which are obtained after the Clarke coordinate conversion is performed on instant values $D_a$, $D_b$ and $D_c$.

5. The detecting method according to claim 1, in the step 5), the way to determine whether the periodic function is an increasing or a decreasing function within one minimum positive period is:

Δy=y(n)−y(n−1), wherein, y(n) and y(n−1) are the output signal values corresponding to the instant values of three-phase AC electrical signals obtained by sampling a electrical signal of the three-phase AC electrical signal at two adjacent sampling timings within one minimum positive period, respectively, if 0<Δy<2π, the periodic function is an increasing function within one minimum positive period; if −2π<Δy<0, the periodic function is a decreasing function within one minimum positive period.

6. The detecting method according to claim 1, said step 1) also including per-unit processing said set of instant values, and the following equation of the per-unit processing is used:

$$d_x = D_x / d_{max} \quad (3)$$

wherein, x is a, b and c, $D_a$, $D_b$ and $D_c$ are the instant values of the three-phase AC electrical signals, $d_{max}$ is the maximum value of three-phase AC electrical signal, $d_a$, $d_b$ and $d_c$ are the per-unit values of the instant values of the three-phase AC electrical signals.

7. The detecting method according to claim 1, the step 3) also including per-unit processing the output signal value, and the following equation of the per-unit processing is used:

$$y^* = y/2\pi \quad (4)$$

wherein, y is the output signal value, y* is the per-unit value of the output signal value.

8. A three-phase AC phase sequence detecting apparatus, including a three-phase AC sampling module, a coordinate system conversion module, an arc tangent function calculation module and a phase sequence direction deciding determining module;

the three-phase AC sampling module performs real-time sampling on the instant values of three-phase AC electrical signals;

the coordinate system conversion module converts the instant values of at least two sets of three-phase AC electrical signals in a three-phase still coordinate system obtained by real-time sampling via the three-phase AC sampling module into electrical signal components in a two-phase still coordinate system respectively, and transfer them to the arc tangent function calculation module in real-time;

the arc tangent function calculation module performs an arc tangent calculation on the electrical signal components, respectively, to obtain at least two output signal values, and transfer them to the phase sequence direction determining module;

the phase sequence direction determining module combines at least two output signal values to form one periodic function, and determines whether the three-phase AC phase sequence is positive or negative based on whether the periodic function is an increasing function or a decreasing function within one minimum positive period, wherein the waveform between two adjacent peaks in the waveform of any phase in three-phase AC electrical signal corresponds to one minimum positive period.

9. The detecting apparatus according to claim 8, said detecting apparatus also including a first per-unit processing module and/or a second per-unit processing module, said first per-unit processing module per-unit processes the instant values of the at least two sets of three-phase AC electrical signals obtained by real-time sampling via said three-phase AC sampling module, and output the per-unit values to the coordinate system conversion module in real-time;

said second per-unit processing module per-unit processes at least two output signals obtained by said arc tangent function calculation module, and output the per-unit values to the phase sequence direction determining module in real-time.

* * * * *